(12) United States Patent
Lulé

(10) Patent No.: US 7,259,364 B2
(45) Date of Patent: Aug. 21, 2007

(54) METHOD FOR THE PRODUCTION OF IMAGE SENSORS

(75) Inventor: Tarek Lulé, Dresden (FR)

(73) Assignee: STMicroelectronics N.V., Amsterdam (NL)

( * ) Notice: Subject to any disclaimer, the term of this patent is extended or adjusted under 35 U.S.C. 154(b) by 155 days.

(21) Appl. No.: 10/497,668

(22) PCT Filed: Dec. 4, 2002

(86) PCT No.: PCT/DE02/04439

§ 371 (c)(1),
(2), (4) Date: Feb. 7, 2005

(87) PCT Pub. No.: WO03/054919

PCT Pub. Date: Jul. 3, 2003

(65) Prior Publication Data

US 2005/0118756 A1    Jun. 2, 2005

(30) Foreign Application Priority Data

Dec. 7, 2001   (DE) .............................. 101 60 234

(51) Int. Cl.
*H01L 31/00*   (2006.01)

(52) U.S. Cl. ................. 250/214.1; 250/208.1

(58) Field of Classification Search ............. 250/208.1, 250/214.1; 257/444, 458, 53; 438/60, 57, 438/75
See application file for complete search history.

(56) References Cited

U.S. PATENT DOCUMENTS 6,501,065 B1   12/2002   Uppal et al.

OTHER PUBLICATIONS

International Search Report from a corresponding International Application WO 03/054919, filed Dec. 4, 2002.
Lule T. et al., "Sensitivity of CMOS Based Imagers and Scaling Perspectives," IEEE Transactions on Electron Devices, IEEE Inc. New York, vol. 47, no. 11, Nov. 2000.
Lule T. et al., "1000 000-Pixel, 120-DB Imager in TFA Technology," IEEE Journal of Solid-State Circuits, IEEE Inc. New York, vol. 35, No. 5, May 1, 2000.

*Primary Examiner*—Thanh X. Luu
*Assistant Examiner*—Tony Ko
(74) *Attorney, Agent, or Firm*—Lisa K. Jorgenson; James H. Morris; Wolf, Greenfield & Sacks, P.C.

(57) ABSTRACT

The invention relates to a method for producing image sensors on the basis of TFA technology including of an amorphous thin-layer system that has been applied on a crystalline ASIC. The inventive method enables the production of image sensors on the basis of TFA technology, which improve the picture quality at low luminous intensity by reducing the dark currents. The photodiodes in the thin-layer material that are configured as pixels are linked with transistor structures in the crystalline ASIC via back electrodes. The transistor structures have particularly low leakage currents due to implantation technology or optimization of the production process.

19 Claims, 1 Drawing Sheet

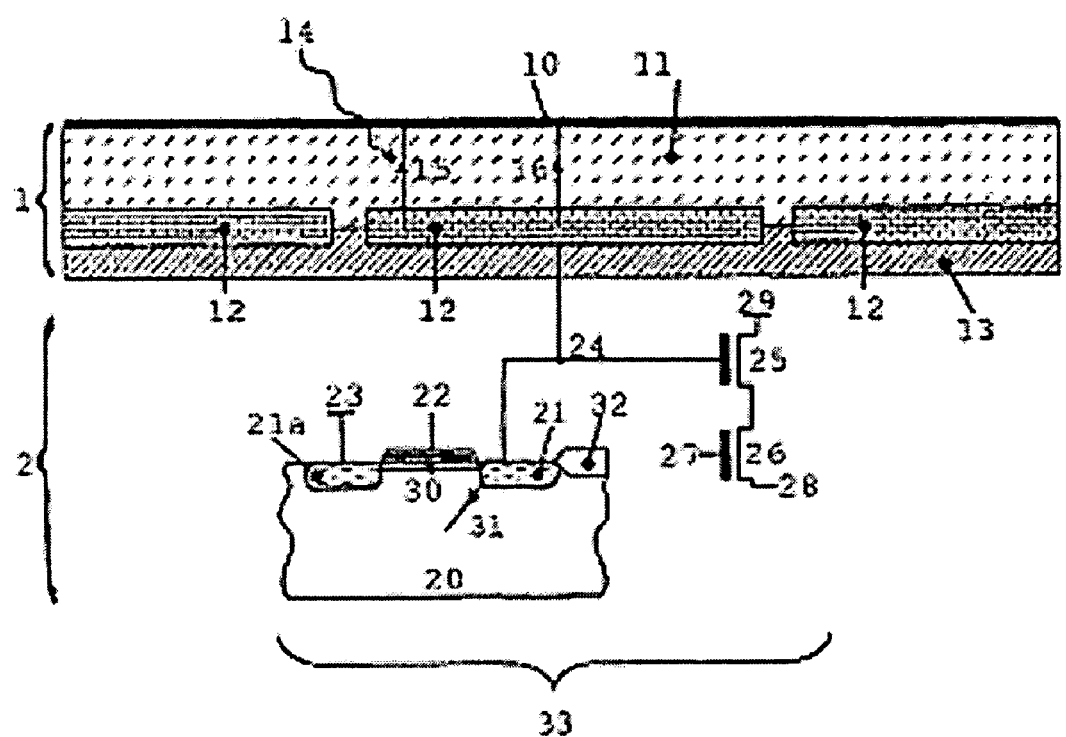

METHOD FOR THE PRODUCTION OF IMAGE SENSORS

BACKGROUND OF THE INVENTION

1. Field of the Invention

The invention relates to a method for producing image sensors on the basis of TFA technology, comprising an amorphous thin-layer system that has been applied on a crystalline ASIC.

2. Discussion of the Related Art

This TFA technology (thin film on ASIC) is known from B. Schneider, P. Rieve, M. Böhm, Image Sensors in TFA (Thin Film on ASIC) Technology, ed. B. Jähne, H. Hausecker, F. Geißler, Handbook of Computer Vision and Applications, pp. 237-270, Academic Press, San Diego, 1999. Thin-layer systems, which can be based on amorphous silicon, for example, and which have been applied on a crystalline ASIC (application specific integrated circuit), convert incident light into a photocurrent, which is further processed by the underlying ASIC. The optoelectronic advantages of the amorphous material are combined with the electrical advantages of the crystalline material and utilized. The thin-layer system can generally be structured on any crystalline ASIC without any problem, with ASICs based on known CMOS technology (complementary metal oxide semiconductor) being especially suited. The circuits necessary for image sensor operation are then realized in the ASIC.

The problem encountered in conventional ASICs is that high leakage currents arise in the crystalline components. These leakage currents become superposed on the photocurrents, and vary from pixel to pixel as well as with temperature.

Since these leakage currents are also converted into signals by the other evaluation circuits of the ASICs, just as the photocurrents, the leakage currents cause spurious signals to be superposed on the useful signals, which become visible in the image as transient noise and fixed noise (also called FPN, fixed pattern noise) in particular given longer integration times and lower luminous intensities, thereby detracting from image quality.

By contrast, the level of leakage current contributed by the thin-layer system is often far lower, and would in and of itself offer a better image quality at low luminous intensities.

SUMMARY OF THE INVENTION

The object of the invention is now to provide image sensors based on TFA technology that offer an improved image quality at low luminous intensities by reducing the dark currents.

The object of the invention is achieved in a method of the kind mentioned at the outset by using back electrodes to link the photodiodes configured as pixels in the thin-layer material with transistor structures in the crystalline ASIC, which have particularly low leakage currents due to a modified implantation technology or optimization of the production stages. In particular, the implantation geometries of the transistor structures are varied in such a way as to realize a lower leakage current.

In a further development of the invention, the transistor structures in the crystalline ASIC are produced in a CMOS process, and the thin-layer system is based on a detector made out of amorphous silicon.

It is also advantageous if the photodiodes in the thin-layer material are arranged pixel by pixel in a two-dimensional matrix, or in one or more one-dimensional lines.

Finally, it makes sense to optimize the substrate to a lower leakage current.

In another embodiment of the invention, the transistor structures are configured per pixel in such a way as to exhibit varying threshold voltages.

The production process according to the invention is generally based on a crystalline standard process, which typically is executed in CMOS technology, but can also be built around other basic processes. It is characterized in that the standard process is optimized to make it suitable for image sensors. The optimizations include:

1) Method for reducing the leakage current sources in the pixel

2) Formation of a photodiode that is incorporated into each pixel, is highly sensitive, and has a low leakage currents, 3) Formation of microlenses on the surface of the image sensor to concentrate the light on the aforementioned photodiode.

The first of the listed optimizations is extremely important for the formation of a TFA image sensor according to the invention. Since these leakage current sources are best sought in the transistors and diodes formed in the crystalline base material, the methods are typically applied to these components and to production stages executed for producing these components.

The procedural steps used to reduce leakage current, for example, involve using modified implantation doses and energies, changing the implantation geometries or omitting individual production stages required for the formation of a transistor in the standard process, but not for the formation of a transistor for a pixel in an image sensor process. The procedural steps can vary from process to process and manufacturer to manufacturer, and the details thereof are not important with respect to the formation of the TFA image sensor. The key characteristic of the procedural steps is that the leakage currents that arise in typical transistor structures are reduced in the ASIC technology used.

All other listed and unlisted optimization measures for an image sensor process are not necessary for the advantageous use of the ASICs for a TFA image sensor, since these are characterized precisely in that the photodiode on the surface of the ASICs is formed in a thin-layer process, and not in the ASIC process.

Therefore, the problem is solved according to the invention by forming an image sensor via the structuring of an ASIC based on an image sensor process, and by using in particular those procedural steps of this image sensor process that yield a reduction in dark currents. However, other procedural steps of the image sensor process can also be applied, provided they are advantageous in terms of forming the image sensor. This includes the formation of transistors in the pixel with varying threshold voltages.

After the ASIC has been structured in the aforementioned manner, the TFA process is executed on the ASIC, and the ASIC thereby made into an image sensor. The essential changes in the prepared ASICs in comparison to an ASIC prepared in a standard process have to do with the deeper planes of the process, the planes in which the transistors and diodes formed in the crystalline material lie. In particular, there is no significant difference between the surface of the ASIC carrying the TFA system and the surface of an ASIC from a standard process onto which a TFA system is applied.

For this reason in particular, the production method involving a TFA system applied on the ASIC fabricated in the image sensor process is the same production method as the one involving an ASIC fabricated in a standard process. The structure of the TFA system is hence no different from the structure of a TFA image sensor based on a standard process.

The advantageous characteristic feature of this image sensor is that the advantages of TFA technology are combined with selected advantages of the image sensor process. In particular, the overall dark current made up of the dark currents of the ASIC and dark current of the TFA diode is less than for an image sensor made with TFA technology based on a standard process, or for an image sensor based solely on a standard process.

Another advantageous feature of the device according to the invention is the fact that it is suitable as much for image sensors using visible light as for image sensors that detect other wavelengths or other types of radiation.

The invention is also suitable for realizing both matrix sensors and line sensors.

BRIEF DESCRIPTION OF THE DRAWINGS

The invention will be described further below based on an exemplary embodiment, making reference to the accompanying FIGURE.

DETAILED DESCRIPTION

The drawing in the FIGURE shows the cross section of an exemplary pixel, which was realized in TFA technology based on CMOS technology.

The TFA system 1 is here structured on the crystalline ASIC 2 (diagrammatic). It is separated from the underlying ASIC by an insulating layer 13. Metallic back electrodes 12 are applied on the latter, and structured pixel by pixel. A thin-layer material 11, e.g., formed out of amorphous silicon, is situated between these back electrodes and the transparent, conductive front electrode 10.

Key details of the ASIC 2 for the invention include the signal collection node 24, which combines all photocurrents and leakage currents into the pixel signal, along with all elements linked directly thereto.

Also included is the transistor structure of the pixel 33 with reset transistor 20 that is formed in the crystalline substrate 2 and comprised of the drain and source diffusion regions 21, 21a, and the gate 22, which is separated from adjacent structures by the insulating layer 32. The reset transistor diverts the photocharge from the signal collection node 24 to a reset line 23.

Situated downstream from the signal collection node 24 are two transistors; one driver transistor 25 connected with the supply voltage 29 and a selection transistor 26, which amplify the collected signal and, when a selection signal is present at the gate 27, drive the pixel signal of the signal collection node 24 to the pixel output line 28.

Any light 14 that hits the TFA system generates a photocurrent 15, which is collected on the signal collection node 24. In addition to the photocurrent, all leakage currents independent of the illumination—so-called dark currents—are collected. In addition to the leakage current of the thin-layer system 16, these also include the leakage currents that arise in the ASIC. In this case, for example, these involve the leakage currents 31 streaming away from the diffusion region 21 allocated to the signal collection node 24 into the substrate 20. In addition, there are leakage currents 30 that proceed from the same diffusion region 21 under the reset gate 22 and stream toward the opposing diffusion region 21a. Other leakage current sources are conceivable, even if not specified in this example.

During realization of the TFA image sensor according to the invention using an image sensor process as the basic process, the leakage currents of the ASIC 30, 31 are reduced with special production methods. The additional modifications of the image sensor process relative to the standard process are unimportant in terms of the invention, although they can be significant for an advantageous realization of the TFA image sensor.

Since the TFA image sensor according to the invention based on an image sensor process is no different from the TFA image sensor according to prior art in terms of basic structure, FIG. 1 also shows the TFA image sensor according to the invention. The individually used methods for reducing leakage currents 30, 31, which are applied to the diffusion region 21, the gate 22, the substrate 20 or other structures enveloping the collection node 24 that contribute leakage current, e.g., the insulating layer 32 and others, can vary greatly, and cannot be shown in this basic drawing.

For example, it would be possible to implant transistor structures of the pixel 33 in diffusion regions 21 in different ways, vary the material for gate 22, specially prepare the substrate 20, or optimize the shape of the enveloping insulating layer 32 toward a lower leakage current.

Having thus described at least one illustrative embodiment of the invention, various alterations, modifications, and improvements will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

Method for the Production of Image Sensors
Reference List

| | |
|---|---|
| 1 | TFA system |
| 2 | Crystalline ASIC |
| 10 | Front electrode |
| 11 | Thin-layer material |
| 12 | Metallic back electrode |
| 13 | Insulating layer |
| 14 | Light |
| 15 | Photocurrent |
| 16 | Leakage current of thin-layer system |
| 20 | Substrate |
| 21 | Diffusion region (drain) |
| 21a | Diffusion region (source) |
| 22 | Reset gate |
| 23 | Reset line |
| 24 | Signal collection node |
| 25 | Driver transistor |
| 26 | Selection transistor |
| 27 | Selection signal |
| 28 | Pixel output line |
| 29 | Supply voltage |
| 30 | Leakage current of ASIC |
| 31 | Leakage current of ASIC |
| 32 | Insulating layer |
| 33 | Transistor structure of pixel |

What is claimed is:

1. A method for producing image sensors based on TFA technology, with an amorphous thin-layer system comprising a thin layer material to form photodiodes that was applied on a crystalline ASIC, which incorporates transistor structures that are used to control photodiode function and linked with the photodiodes via signal collection nodes, wherein the photodiodes in the thin-layer material arranged pixel by pixel are each linked via back electrodes with transistor structures in the crystalline ASIC, which have an especially low leakage current by providing a signal collection node which combines all photocurrents and leakage currents into a pixel signal, along with all elements linked thereto and by providing a pixel structure with a reset transistor formed in a crystalline substrate and drain and source diffusion regions and a gate separated from adjacent structures by an insulating layer;

wherein in that implantation geometries of the transistor structures are altered in such a way that a photodiode is incorporated into each pixel to realize a lower leakage current.

2. The method according to claim 1, wherein in that the transistor structures in the crystalline ASIC are produced in a CMOS process.

3. The method according to claim 1, wherein in that the thin-layer system is based on a detector made out of amorphous silicon.

4. The method according to claim 1, wherein in that the photodiodes in the thin-layer material are arranged pixel by pixel in a two-dimensional matrix.

5. The method according to claim 1, wherein in that the photodiodes in the thin-layer material are arranged pixel by pixel in one or more one-dimensional lines.

6. The method according to claim 4, wherein in that the transistor structures of each pixel have different threshold voltages.

7. The method according to claim 1, wherein the transistors and diodes formed in the crystalline lie in deep planes of the crystalline substrate to optimize to a lower leakage current.

8. A method for producing image sensors based on TFA technology, with an amorphous thin-layer system comprising a thin layer material to form photodiodes that was applied on a crystalline ASIC, which incorporates transistor structures that are used to control photodiode function and linked with the photodiodes via signal collection nodes, wherein the photodiodes in the thin-layer material arranged pixel by pixel are each linked via back electrodes with transistor structures in the crystalline ASIC, which have an especially low leakage current by providing a signal collection node which combines all photocurrents and leakage currents into a pixel signal, along with all elements linked thereto and by providing a pixel structure with a reset transistor formed in a crystalline substrate and drain and source diffusion regions and a gate separated from adjacent structures by an insulating layer;

wherein the transistors and diodes formed in the crystalline lie in deep planes of the crystalline substrate to optimize to a lower leakage current.

9. The method according to claim 8, wherein in that the transistor structures in the crystalline ASIC are produced in a CMOS process.

10. The method according to claim 8, wherein in that the thin-layer system is based on a detector made out of amorphous silicon.

11. The method according to claim 8, wherein in that the photodiodes in the thin-layer material are arranged pixel by pixel in a two-dimensional matrix.

12. The method according to claim 8, wherein in that the photodiodes in the thin-layer material are arranged pixel by pixel in one or more one-dimensional lines.

13. The method according to claim 12, wherein in that the transistor structures of each pixel have different threshold voltages.

14. A method of optimizing the production of image sensors that incorporate TFA technology, the method comprising:

forming an amorphous thin-layer system that includes photodiodes arranged pixel by pixel in the thin-layer;

forming a crystalline ASIC that includes transistor structures used to control photodiode function, the transistor structures linked with the photodiodes via signal collection nodes, wherein the photodiodes are linked via back electrodes to the transistor structures in the crystalline ASIC;

altering implantation geometries used to form the amorphous thin-layer system; and then repeating, with the altered implantation geometries, the steps of forming an amorphous thin-layer system and forming a crystalline ASIC;

identifying which implantation geometries provide a lower leakage current in the resulting image sensor.

15. The method according to claim 14, wherein the transistor structures in the crystalline ASIC are produced in a CMOS process.

16. The method according to claim 14, wherein the thin-layer system is based on a detector made out of amorphous silicon.

17. The method according to claim 14, wherein the photodiodes in the thin-layer are arranged pixel by pixel in a two-dimensional matrix.

18. The method according to claim 14, wherein the transistor structures associated with each of the photodiodes have different threshold voltages.

19. The method of claim 14, wherein the step of forming an amorphous thin-layer system and forming a crystalline ASIC are each repeated multiple times.

* * * * *

UNITED STATES PATENT AND TRADEMARK OFFICE
CERTIFICATE OF CORRECTION

PATENT NO. : 7,259,364 B2 Page 1 of 1
APPLICATION NO. : 10/497668
DATED : August 21, 2007
INVENTOR(S) : Tarek Lule It is certified that error appears in the above-identified patent and that said Letters Patent is hereby corrected as shown below:

On the title page item (75) should read:
(75) Inventor: Tarek Lulé, Saint Egrève, France Col. 2, line 19 should read:
current, Signed and Sealed this Sixth Day of November, 2007

JON W. DUDAS
*Director of the United States Patent and Trademark Office*